US012603264B2

(12) United States Patent (10) Patent No.: US 12,603,264 B2
Lin et al. (45) **Date of Patent: \*Apr. 14, 2026**

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: Yen-Liang Lin, Hsinchu (TW); Yu-Kang Huang, Hsinchu (TW); Yu-Chuan Tai, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/748,650

(22) Filed: Jun. 20, 2024

(65) Prior Publication Data

US 2024/0347327 A1 Oct. 17, 2024

Related U.S. Application Data

(63) Continuation of application No. 18/162,274, filed on Jan. 31, 2023, now Pat. No. 12,087,563.

(Continued)

(51) Int. Cl.
*H01J 37/34* (2006.01)
*C23C 14/18* (2006.01)
(Continued)

(52) U.S. Cl.
CPC .......... *H01J 37/345* (2013.01); *C23C 14/185* (2013.01); *C23C 14/35* (2013.01);
(Continued)

(58) Field of Classification Search
CPC .............. H01J 37/345; H01J 37/32449; H01J 37/3426; H01J 37/3464; H01J 37/3476;
(Continued)

(56) References Cited

U.S. PATENT DOCUMENTS 4,631,106 A 12/1986 Nakazato et al.
4,853,102 A * 8/1989 Tateishi ............ H01J 37/32688
204/298.25

(Continued)

FOREIGN PATENT DOCUMENTS

TW 200720456 6/2007
TW 200720456 A 6/2007
(Continued)

*Primary Examiner* — Rodney G McDonald
(74) *Attorney, Agent, or Firm* — Harrity & Harrity, LLP

(57) ABSTRACT

Some implementations described herein provide a physical vapor deposition tool. The physical vapor deposition tool includes a magnet component, a single cathode, and a power circuit for biasing a pedestal that supports a semiconductor substrate. During a deposition operation that deposits an inert metal material, the physical vapor deposition tool may modulate an electromagnetic field emanating from the magnet component that includes spiral-shaped bands having different ranges of magnetic strength. The physical vapor deposition tool may have an increased throughput relative to a physical vapor deposition tool without the magnet component, the single cathode, and the power circuit. Additionally, or alternatively, the inert metal material may have a grain size that is greater relative to a grain size of an inert metal material deposited using the physical vapor deposition tool without the magnet component, the single cathode, and the power circuit.

20 Claims, 12 Drawing Sheets

Related U.S. Application Data

(60) Provisional application No. 63/375,799, filed on Sep. 15, 2022.

(51) Int. Cl.
C23C 14/35 (2006.01)
C23C 14/54 (2006.01)
H01J 37/32 (2006.01)

(52) U.S. Cl.
CPC ........ C23C 14/54 (2013.01); H01J 37/32449 (2013.01); H01J 37/3426 (2013.01); H01J 37/3464 (2013.01); H01J 37/3476 (2013.01); H01J 37/32082 (2013.01); H01J 2237/24564 (2013.01); H01J 2237/332 (2013.01)

(58) Field of Classification Search
CPC ....... H01J 37/32082; H01J 2237/24564; H01J 2237/332; C23C 14/185; C23C 14/35; C23C 14/54; C23C 14/345

USPC .......................................... 204/298.2, 298.16
See application file for complete search history.

(56) References Cited

U.S. PATENT DOCUMENTS

| | | | |
|---|---|---|---|
| 9,234,276 | B2 | 1/2016 | Varadarajan |
| 12,087,563 | B2 * | 9/2024 | Lin ..................... H01J 37/3476 |
| 2002/0069971 | A1 | 6/2002 | Kaji et al. |
| 2020/0395198 | A1 * | 12/2020 | Allen ................ H01J 37/32477 |
| 2021/0115554 | A1 * | 4/2021 | Cheng ..................... C23C 16/34 |
| 2022/0359174 | A1 * | 11/2022 | Wang .................. H01J 37/3458 |
| 2024/0096609 | A1 | 3/2024 | Lin et al. |

FOREIGN PATENT DOCUMENTS

| | | |
|---|---|---|
| TW | 201839162 | 11/2018 |
| TW | 201839162 A | 11/2018 |
| WO | 2007032858 | 3/2007 |
| WO | 2007032858 A1 | 3/2007 |

* cited by examiner

300

308

306d

306e

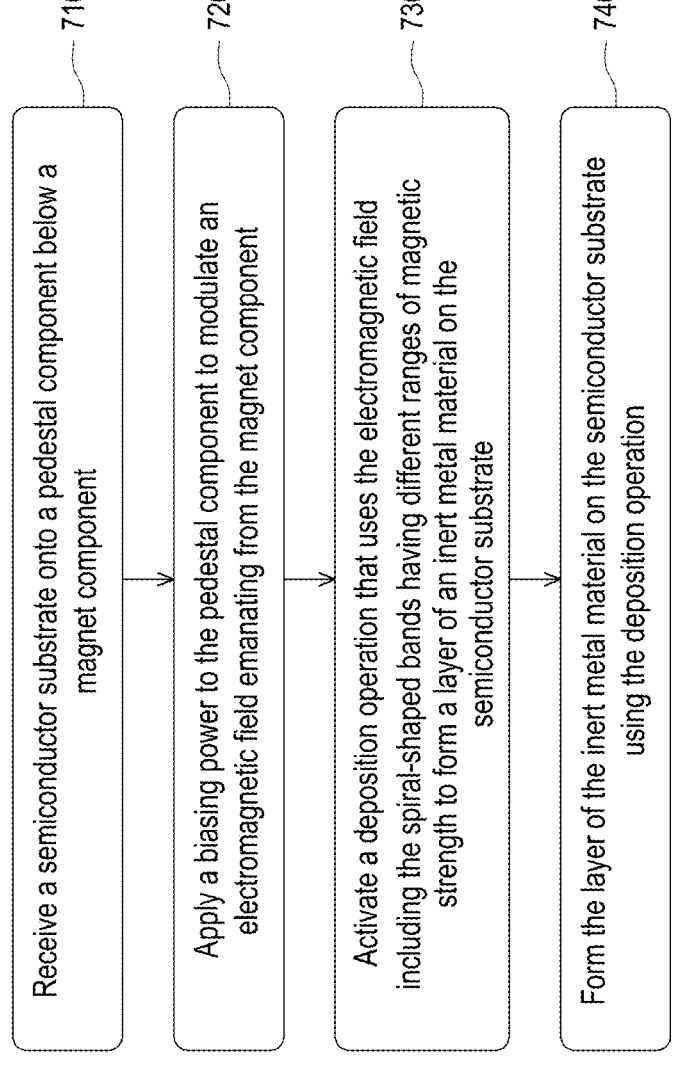

700

710 Receive a semiconductor substrate onto a pedestal component below a magnet component 720 Apply a biasing power to the pedestal component to modulate an electromagnetic field emanating from the magnet component 730 Activate a deposition operation that uses the electromagnetic field including the spiral-shaped bands having different ranges of magnetic strength to form a layer of an inert metal material on the semiconductor substrate 740 Form the layer of the inert metal material on the semiconductor substrate using the deposition operation

FIG. 7

SEMICONDUCTOR PROCESSING TOOL AND METHODS OF OPERATION

CROSS-REFERENCE TO RELATED APPLICATIONS

This Patent Application is a continuation of U.S. patent application Ser. No. 18/162,274, filed Jan. 31, 2023, and entitled "SEMICONDUCTOR PROCESSING TOOL AND METHODS OF OPERATION," which claims priority to Provisional Patent Application No. 63/375,799, filed Sep. 15, 2022, and entitled "SEMICONDUCTOR PROCESSING TOOL AND METHODS OF OPERATION." The disclosures of the prior Applications are considered part of and are incorporated by reference into this Patent Application.

BACKGROUND

A physical vapor deposition (PVD) tool, such as a sputtering tool (or sputter deposition tool) includes a semiconductor processing tool that performs a physical vapor deposition operation within a processing chamber to deposit material onto a semiconductor substrate such as a wafer. The material may include a metal, a dielectric, or another type of material. A physical vapor deposition operation (such as a sputtering operation) may include placing the semiconductor substrate on an anode in a processing chamber, in which a gas is supplied and ignited to form a plasma of ions of the gas. The ions in the plasma are accelerated toward a cathode formed of the material to be deposited, which causes the ions to bombard the cathode and release particles of the material. The anode attracts the particles, which causes the particles to travel toward and deposit onto the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a flowchart of an example process associated with performing a deposition operation using the deposition tool described herein.

DETAILED DESCRIPTION

Figure 1:
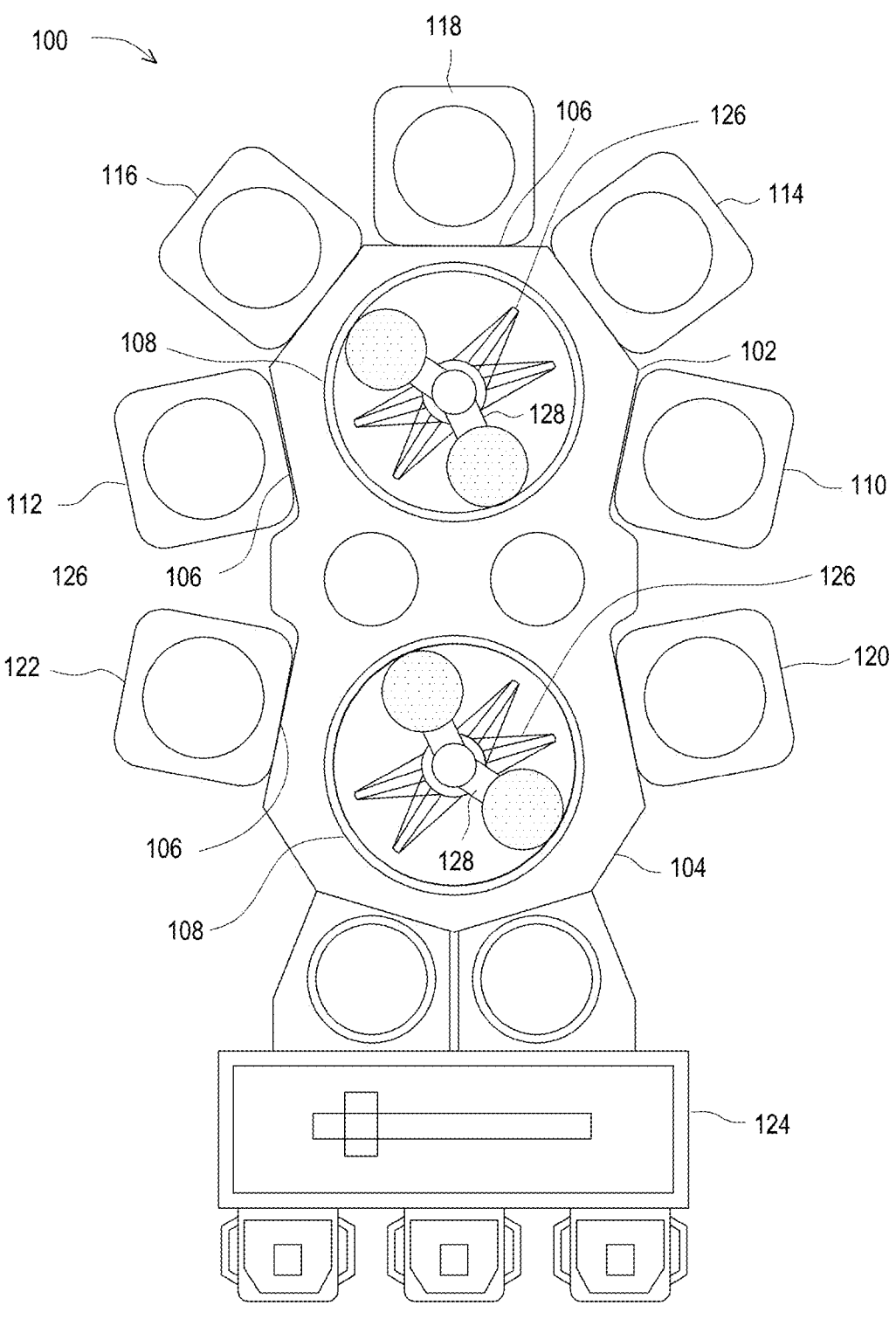
FIG. 1 is a diagram of an example semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A processing chamber of a physical vapor deposition tool may include a target structure and a pedestal component (e.g., a hot-plate or an electrostatic chuck, among other examples) on which a semiconductor substrate is positioned below the target structure. During a physical vapor deposition operation, such as a sputtering operation, inert metal material sourced from the target structure is deposited onto the semiconductor substrate using a plasma formed from a gas supplied between the target structure and the semiconductor substrate.

In some cases, the physical vapor deposition tool may include a magnet component and multiple cathodes. The physical vapor deposition tool may include one or more electrical biasing circuitries to accelerate ions during a deposition operation that deposits a layer of an inert metal material on a semiconductor substrate. In such cases, the physical vapor deposition tool may have a deposition rate that is not suitable for mass production, causing a manufacturer to deploy additional physical vapor deposition tools and/or support infrastructure (e.g., computing resources) to support manufacturing a large volume of integrated circuit (IC) devices.

In other cases, the physical vapor deposition tool may include a single cathode and be configured to deposit a layer of an inert metal material without electrical biasing circuitries. In such other implementations, the physical vapor deposition tool may have a higher effective deposition rate (than a multiple cathode physical vapor deposition tool), but the layer of inert metal material may have a grain size causing a resistivity characteristic for one or more structures formed from the inert metal material. Integrated circuit devices having the resistivity characteristic based on the grain size may fail during parametric testing thereby reducing a yield of the integrated circuit devices. Additionally, or alternatively, one or more of the integrated circuit devices including the layer of inert metal material may fail during field use, increasing a field return rate and requiring additional physical vapor deposition tools and/or support infrastructure on behalf of the manufacturer.

Some implementations described herein provide a physical vapor deposition tool. The physical vapor deposition tool includes a magnet component, a single cathode, and a power circuit for biasing a pedestal component that supports a semiconductor substrate. During a deposition operation that deposits an inert metal material and using the power circuit to bias the pedestal component, the physical vapor deposition tool may modulate an electromagnetic field emanating from the magnet component. The electromagnetic field includes spiral-shaped bands having different ranges of magnetic strengths. The magnetic structure includes a pair of intertwined spiral-shaped magnets having opposite magnetic orientations. The intertwined spiral-shape of the pair of magnets provides for the magnetic strength of the magnetic structure to be more uniformly distributed across the width of the magnetic structure. Thus, a maximum density of the plasma formed in the process chamber can be reduced without increasing the distance between the target layer and the wafer pedestal and without removing the bias voltage from the wafer. As a result, a likelihood of plasma leakage can be reduced without diminishing the deposition rate of the sputtering and without increasing the resistivity of the films formed by the sputtering. Within the physical vapor deposition tool, a spacing between the magnet component and pedestal component (e.g., a semiconductor substrate supported by the pedestal component) may be reduced (relative to another physical vapor deposition tool) such that one or more properties of the electromagnetic field (e.g., a strength or polarity) are redistributed to increase a deposition rate. As such, the physical vapor deposition tool may have an increased throughput relative to a physical vapor deposition tool without the magnet component, the single cathode, the power circuit, and/or the reduced spacing. Additionally, or alternatively, the layer of the inert metal may have a grain size that is greater relative to a grain size of a layer of the inert metal deposited using the physical vapor deposition tool without the magnet component, the single cathode, the power circuit, and/or the reduced spacing. With such a grain size, a resistivity of the inert metal layer may be reduced.

In this way, a number of resources (e.g., a number of physical vapor deposition tools and supporting infrastructure, such as computing or network resources) required to fabricate a quantity of integrated circuit devices may be reduced. Additionally, or alternatively, a resistivity characteristic of the integrated circuit devices may be reduced to improve a yield and/or a performance of the integrated circuit devices.

FIG. 1 is a diagram of an example semiconductor processing system 100 described herein. The semiconductor processing system 100 may perform one or more deposition processes, such as a physical vapor deposition (PVD) process, a chemical vapor deposition (CVD) process, a plasma-enhanced CVD (PECVD) process, a high-density plasma CVD (HDP-CVD) process, a sub-atmospheric CVD (SACVD) process, an atomic layer deposition (ALD) process, and/or a plasma-enhanced atomic layer deposition (PEALD) process, among other examples. As described herein, a physical vapor deposition process may correspond to a sputtering process.

In some implementations, and as shown in FIG. 1, the semiconductor processing system 100 includes one or more main frames 102, 104 having a plurality of sidewalls 106. The main frames 102, 104 and the plurality of sidewalls 106 may provide structural support to the semiconductor processing system 100.

A plurality of vacuum load lock chambers 108 is located in the center of main frames 102, 104. In some implementations, one or more of the vacuum load lock chambers 108 is maintained in a vacuum state to stage semiconductor substrates (e.g., silicon wafers, among other examples) for processing within the semiconductor processing system 100 to receive the semiconductor substrates after processing within the semiconductor processing system 100. Each of the plurality of vacuum load lock chambers 108 spatially separates the semiconductor substrates from processing chambers of the semiconductor processing system 100.

The semiconductor processing system 100 includes a plurality of processing chambers 110, 112, 114, 116, 118, 120, and 122. Each processing chamber may include one or more components to deposit material using a deposition process onto a semiconductor substrate received from one of the plurality of vacuum load lock chambers 108.

An external semiconductor substrate elevator 124 is located adjacent to the semiconductor processing system 100. In some implementations, the external semiconductor substrate elevator 124 is a part of the semiconductor processing system 100. In some implementations, the external semiconductor substrate elevator 124 is a component that is separate from the semiconductor processing system 100. The external semiconductor substrate elevator 124 is configured to hold a cassette containing a plurality of semiconductor substrates. The external semiconductor substrate elevator 124 also includes an automatic distributor for selecting a semiconductor substrate from the plurality of semiconductor substrates and timely supplying the selected semiconductor substrate to one of the plurality of vacuum load lock chambers 108 to stage for processing by one of the processing chambers 110-122.

The semiconductor processing system 100 may further include, within one or more of the plurality of vacuum load lock chambers 108, a semiconductor substrate transfer system 126 including a plurality of robotic arms 128. The semiconductor substrate transfer system 126, including the plurality of robotic arms 128, may operate in conjunction with the external semiconductor substrate elevator 124 to transport semiconductor substrates amongst a cassette on the external semiconductor substrate elevator 124, and to and/or from one or more of the processing chambers 110-122.

One or more of the processing chambers 110-122 may be subjected to a deposition operation to clean the one or more of the processing chambers 110-122 and to maintain a degree of cleanliness in the one or more of the processing chambers 110-122. Examples of such a deposition operation include a burn-in deposition operation that forms a plasma to remove particulates from a target structure material within the one or more of the processing chambers 110-122, a pasting deposition operation that coats an interior surface within the one or more of the processing chambers 110-122 to prevent flaking of particulates from the interior surface, and/or another deposition operation.

As indicated above, FIG. 1 is provided as an example. Other examples may differ from what is described with regard to FIG. 1. For example, another example may include additional components, fewer components, different components, or differently arranged components than those shown in FIG. 1. Additionally, or alternatively, a set of components (e.g., one or more components) of FIG. 1 may perform one or more functions described herein as being performed by another set of components.

Figure 2A:
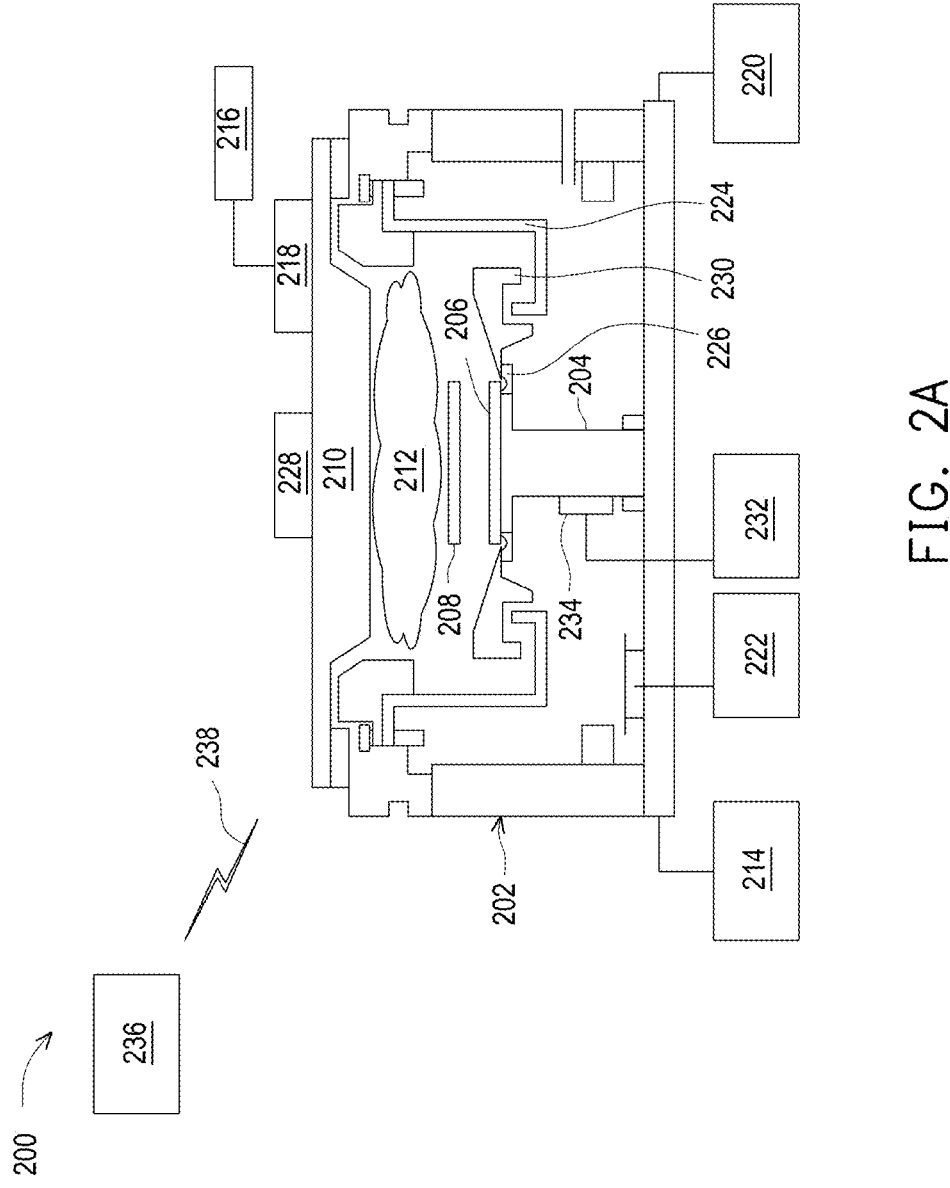
FIGS. 2A and 2B are diagrams of an example deposition tool described herein for use in the semiconductor processing tool of FIG. 1.
Figure 2B:
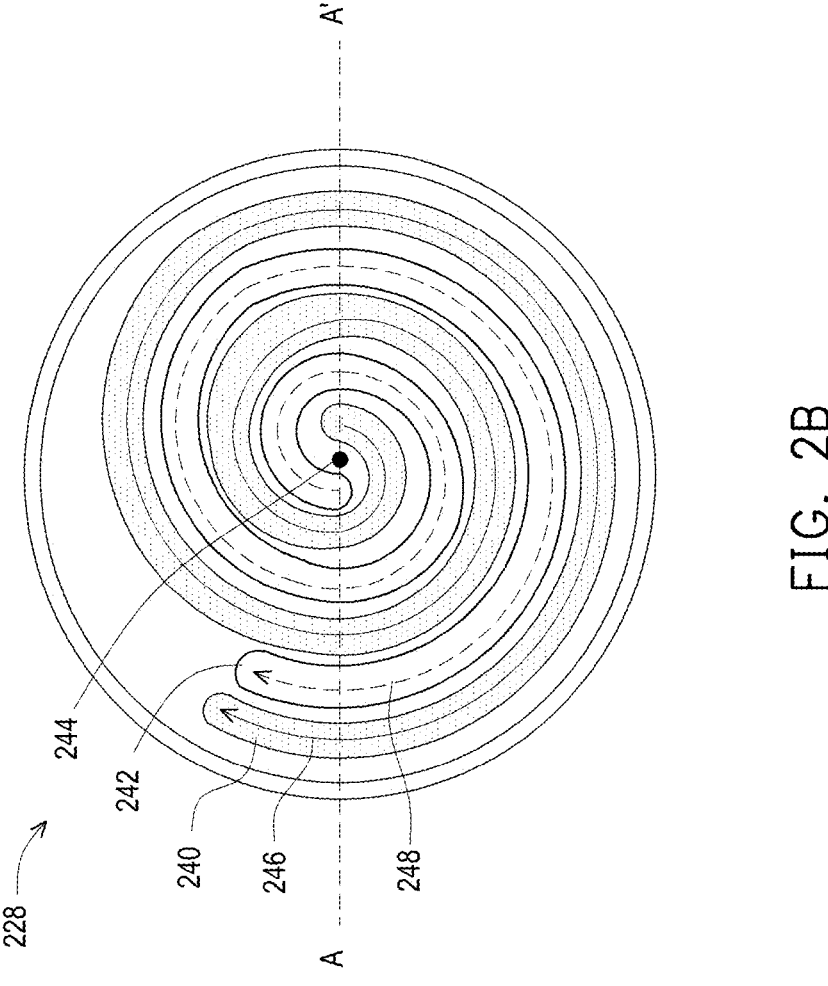

FIGS. 2A and 2B are diagrams of an example deposition tool 200 described herein for use in the semiconductor processing tool of FIG. 1. In some implementations, the deposition tool 200 corresponds to a physical vapor deposition tool (e.g., a sputtering tool, among other examples).

The deposition tool 200 includes a processing chamber 202 which may correspond to one of the processing chambers 110-122 as described in connection with FIG. 1. The deposition tool 200 further includes a pedestal component 204 including a chuck (e.g., an electrostatic chuck (ESC) or a vacuum chuck, among other examples) upon which a semiconductor substrate 206 (e.g., a semiconductor wafer) is positioned and secured. In some implementations, the pedestal component 204 includes a heating component (e.g., a hot plate, among other examples) to provide heat to the semiconductor substrate 206 during the deposition process and/or the sputtering operation. The pedestal component 204 may be, for example, fabricated from aluminum, stainless steel, ceramic, or combinations thereof.

The deposition tool 200 further includes a shutter disc 208. The shutter disc 208 is an approximately round or an approximately disc-shaped component that is used in a conditioning operation (e.g., a cleaning operation) in the processing chamber 202. During the conditioning operation, a rotating arm or other component (e.g., the robotic arm 128) may position the shutter disc 208 onto or over surfaces of the pedestal component 204 in place of the semiconductor substrate 206. During the conditioning operation, the shutter disc 208 protects the pedestal component 204 and one or more other components adjacent to and/or around the pedestal component 204 from particulates or contaminants that may be generated in the deposition operation.

In some implementations, the deposition tool 200 includes a target structure 210. The target structure 210 may include an inert metal material (e.g., a ruthenium (Ru) metal material, a platinum (Pt) metal material, and/or an iridium (Ir) metal material, among other examples) in solid form that is to be deposited on the semiconductor substrate 206. A plasma 212 may be formed from a gas (e.g., krypton (Kr), argon (Ar), or another chemically inert gas, among other examples) and supplied between the target structure 210 and the semiconductor substrate 206. One or more electrical bias voltages may be applied to the target structure 210 and/or the pedestal component 204. An electrical bias may be applied to the target structure 210 to cause ions in the plasma 212 to accelerate towards the target structure 210 to sputter etch the target structure 210. This causes material of the target structure 210 to be dislodged and mobilized. An electrical bias may be applied to the pedestal component 204 to generate an electrical potential or electric field between the target structure 210 and the semiconductor substrate 206. This promotes or facilitates a flow of particulates of the inert metal material that are dislodged from the target structure 210 toward the semiconductor substrate 206. In some implementations, applying the electrical bias to the pedestal component 204 may modulate an electromagnetic field (e.g., alter or change a magnetic flux or strength of the electromagnetic field, among other examples) between the semiconductor substrate 206 and the target structure 210.

An example of a biasing power source that may be included in the deposition tool 200 includes a radio frequency (RF) power circuit 214. The radio frequency power circuit 214 generates a radio frequency bias voltage within the processing chamber 202. The radio frequency bias voltage may promote or facilitate a flow of the inert metal material that was dislodged from the target structure 210 toward the semiconductor substrate 206. Another radio frequency bias voltage may be used in connection with generating the plasma 212 and/or accelerating ions in the plasma 212 toward the target structure 210.

Another example of a biasing power source that may be included in the deposition tool 200 includes a direct current (DC) power circuit 216. The direct current power circuit 216 generates direct current power in the form of a direct current bias voltage. In some implementations, the direct current power circuit 216 is connected to the target structure 210 using an electrode 218 and is configured to supply the target structure 210 with the direct current bias voltage. In some implementations, the direct current bias voltage provided to the target structure 210 by the direct current power circuit 216 is included in a range of approximately 250 volts to approximately 300 volts. However, other values and ranges for the direct current bias voltage provided by the direct current power circuit 216 are within the scope of the present disclosure.

In some implementations, the deposition tool 200 includes a gas supply system 220 that supplies one or more gases used to form plasmas (e.g., the plasma 212 used for the deposition process or another plasma used for the deposition operation, among other examples). The gas supply system 220 may control a rate of flow of the gas (e.g., argon (Ar) or krypton (Kr), among other examples), which controls one or more parameters of the plasma 212 including the ionization rate in the plasma 212, the ion passivation rate on the semiconductor substrate 206, and/or another parameter.

The deposition tool 200 further includes a vacuum pump 222. The vacuum pump 222 is connected to the deposition tool 200. The vacuum pump 222 is configured to create a vacuum state in the processing chamber 202 during the deposition process and/or the deposition operation. During a sputtering operation, the vacuum pump 222 may maintain a pressure within the processing chamber 202 to approximately 5 millitorrs (mtorr) or less. However, other values for the pressure maintained within the processing chamber 202 by the vacuum pump 222 are within the scope of the present disclosure.

The deposition tool 200 further includes a lower shield 224 and a platen ring 226. The lower shield 224 may shield the semiconductor substrate 206 during the deposition process and shield the shutter disc 208 during the deposition operation. The platen ring 226 may assist maintaining a position of the semiconductor substrate 206 during the deposition process and assist maintaining a position of the shutter disc 208 during the deposition operation. The platen ring 226 may be fabricated from a material that can resist erosion by the generated plasma 212, for example, a metallic material such as stainless steel, titanium, or aluminum, or a ceramic material such as aluminum oxide. However, another suitable material may be used such as a synthetic rubber, a thermoset, a plastic, a thermoplastic, or any other material that meets a chemical compatibility, durability, sealing, and/or temperature requirement of the deposition process and/or the deposition operation.

The deposition tool 200 further includes a magnet component 228. In some implementations, the magnet component 228 enhances consumption of the inert metal material from the target structure 210 during the deposition process. In some implementations, the magnet component 228 corresponds to an electromagnet. The magnet component 228 may, in some implementations, include an array or combinations of magnets.

In some implementations, the deposition tool 200 includes an upper shield 230. The upper shield 230 is positioned adjacent to the lower shield 224. The upper shield 230 may be supported by the lower shield 224. The lower shield 224 and the upper shield 230 cooperate to reduce or eliminate materials from the target structure 210 from coming in contact with components (e.g., the pedestal component 204) of the deposition tool 200. The lower shield 224 and the upper shield 230 may be fabricated from a material that can resist erosion by the generated plasma 212, such as a stainless-steel material, a titanium material, an aluminum material, or a ceramic material, among other examples.

As shown in FIG. 2A, the deposition tool 200 further includes a direct current power circuit 232. The direct current power circuit 232 is configured to supply an electrical biasing voltage (e.g., a power) to the pedestal component 204 in the form of a direct current bias voltage. In some implementations, the direct current power circuit 232 includes one or more sensors (e.g., a voltage sensor and/or a current sensor, among other examples) configured to measure the electrical biasing voltage (and or an electrical current) provided by the direct current power circuit 232 to the pedestal component 204. In other words, the direct current power circuit 232 may include a feedback loop. In some implementations, the direct current power circuit 232 is connected to the pedestal component 204 using an electrode 234 to provide the pedestal component 204 with the direct current bias voltage. In some implementations, the direct current bias voltage provided to the pedestal component 204 by the direct current power circuit 232 is included in a range of approximately −20 volts to approximately −50 volts. However, other values and ranges for the direct current bias voltage provided by the direct current power circuit 232 to the pedestal component 204 are within the scope of the present disclosure.

The deposition tool 200 includes a controller 236. The controller 236 (e.g., a processor, a combination of a processor and memory, among other examples) may communicatively couple to one or more components of the deposition tool 200 (e.g., the radio frequency power circuit 214, the direct current power circuit 216, the gas supply system 220, and/or the direct current power circuit 232, among other examples) using one or more communication links 238. The one or more communication links 238 may include or more wireless-communication links, one or more wired-communication links, or a combination of one or more wireless-communication links and one or more wired-communication links, among other examples. In some implementations, the controller 236 is configured to monitor an amount of the power provided by the direct current power circuit 232 to the pedestal component 204 (e.g., monitor the one or more sensors in the direct current power circuit 232). In some implementations, the controller 236 is external to the deposition tool 200.

In some implementations, the controller 236 may activate, and/or change a setting of, the radio frequency power circuit 214, the direct current power circuit 216, the gas supply system 220, and/or the direct current power circuit 232 based on a machine learning model. The machine learning model may include and/or may be associated with one or more of a neural network model, a random forest model, a clustering model, and/or a regression model, among other examples. In some implementations, the controller 236 uses the machine learning model to modulate an electromagnetic field emanating from the magnet component 228 by providing candidate deposition rates and/or grain sizes associated with a layer of an inert metal material being deposited on the semiconductor substrate 206 as input to the machine learning model, and using the machine learning model to determine a likelihood, probability, or confidence that a particular outcome (e.g., the deposition rate and/or grain size) for a subsequent deposition operation (e.g., a sputtering operation) will be achieved using the candidate parameters. In some implementations, the controller 236 provides ranges of magnetic strengths associated with the electromagnetic field generated by the magnet component 228 as input to the machine learning model, and the controller 236 uses the machine learning model to determine or identify a particular combination of voltage parameters (or current parameters) from the direct current power circuit 216 that is likely to achieve the deposition rate and/or grain size.

The controller 236 (or another system) may train, update, and/or refine the machine learning model to increase the accuracy of the outcomes and/or parameters determined using the machine learning model. The controller 236 may train, update, and/or refine the machine learning model based on feedback and/or results from the subsequent deposition operation, as well as from historical or related deposition operations (e.g., from hundreds, thousands, or more historical or related deposition operations) performed by the deposition tool 200.

As an example, the controller 236 may determine a correlation relating to a setting of the direct current power circuit 232 to a grain size of the layer of the inert metal material deposited on the semiconductor substrate 206. The controller 236 may then provide information relating to the correlation to update the machine learning model.

FIG. 2B illustrates a top view of an example implementation of the magnet component 228 of FIG. 2A. As shown in FIG. 2B, a magnet 240 and a magnet 242 of the magnet component 228 are spiral-shaped. The magnet 240 (e.g., a first spiral-shaped magnet) and the magnet 242 (e.g., a second spiral-shaped magnet) are intertwined around a center 244 of the processing chamber 202. The magnet 240 and the magnet 242 laterally surround the center 244 of the processing chamber 202 in a first spiral-shaped path 246 and a second spiral-shaped path 248, respectively. A distance between the magnet 240 and the center 244 of the processing chamber 202 increases as a length of the magnet 240 increases as measured from a point along the magnet 240 nearest the center 244 of the processing chamber 202. The magnet 242 is between sidewalls of the magnet 240 along the length of the magnet 242.

As described in greater detail in connection with FIGS. 3A-7 and elsewhere herein, the deposition tool 200 may perform a semiconductor manufacturing operation. The semiconductor manufacturing operation includes receiving the semiconductor substrate 206 on the pedestal component 204 below the magnet component 228. The semiconductor manufacturing operation includes applying a biasing power to the pedestal component 204 to modulate an electromagnetic field emanating from the magnet component 228, where the electromagnetic field includes spiral-shaped bands having different ranges of magnetic strength. The semiconductor manufacturing operation includes activating a deposition operation that uses the electromagnetic field including the spiral-shaped bands having different ranges of magnetic strength to form a layer of an inert metal material on the semiconductor substrate 206. The semiconductor manufacturing operation includes forming the layer of the inert metal material on the semiconductor substrate 206 using the deposition operation.

Additionally, or alternatively and as described in greater detail in connection with FIGS. 3A-7 and elsewhere herein, the deposition tool 200 includes the magnet component 228. In some implementations, the magnet component 228 includes an electromagnet. In some implementations, the magnet component 228 includes a permanent magnet. The deposition tool 200 includes the processing chamber 202 below the magnet component 228. The deposition tool 200 includes the target structure 210 including an inert metal material within processing chamber 202, where the target structure 210 is configured to perform as a single cathode within the processing chamber 202 during a sputtering (e.g., deposition) operation within the processing chamber 202. The deposition tool 200 includes the pedestal component 204 below the target structure 210 within the processing chamber 202, where the pedestal component 204 is configured to support the semiconductor substrate 206 during the sputtering operation within the processing chamber 202. The deposition tool 200 includes the direct current power circuit 232 connected to the pedestal component 204. The deposition tool 200 includes the controller 236 configured to activate the direct current power circuit 232 to provide a biasing power to the pedestal component 204 during the sputtering operation, where providing the biasing power to the pedestal component 204 modulates an electromagnetic field including spiral-shaped bands generated by the magnet component 228, and where the pedestal component 204 performs as an anode during the sputtering operation. The magnet component 228 and the target structure 210 perform as a cathode.

Additionally, or alternatively and as described in greater detail in connection with FIGS. 3A-7 and elsewhere herein, portions of the deposition tool 200 may correspond to a device. The device includes the magnet component 228, a single cathode (e.g., the target structure 210), the gas supply system 220, and the direct current power circuit 232. The device includes the controller 236 configured to activate the direct current power circuit 232 to bias the semiconductor substrate 206 and modulate an electromagnetic field emanating from the magnet component 228, where the electromagnetic field includes spiral-shaped bands having different ranges of magnetic strength. The controller 236 is further configured to activate the gas supply system 220 and the single cathode, where the gas supply system 220 and the single cathode are used in connection with generating the plasma 212 over the semiconductor substrate 206.

As indicated above, FIGS. 2A and 2B are provided as examples. Other examples may differ from what is described with regard to FIGS. 2A and 2B. For example, another example may include additional components, fewer components, different components, or differently arranged components than those shown in FIGS. 2A and 2B. Additionally, or alternatively, a set of components (e.g., one or more components) of FIGS. 2A and 2B may perform one or more functions described herein as being performed by another set of components.

Figure 3A:
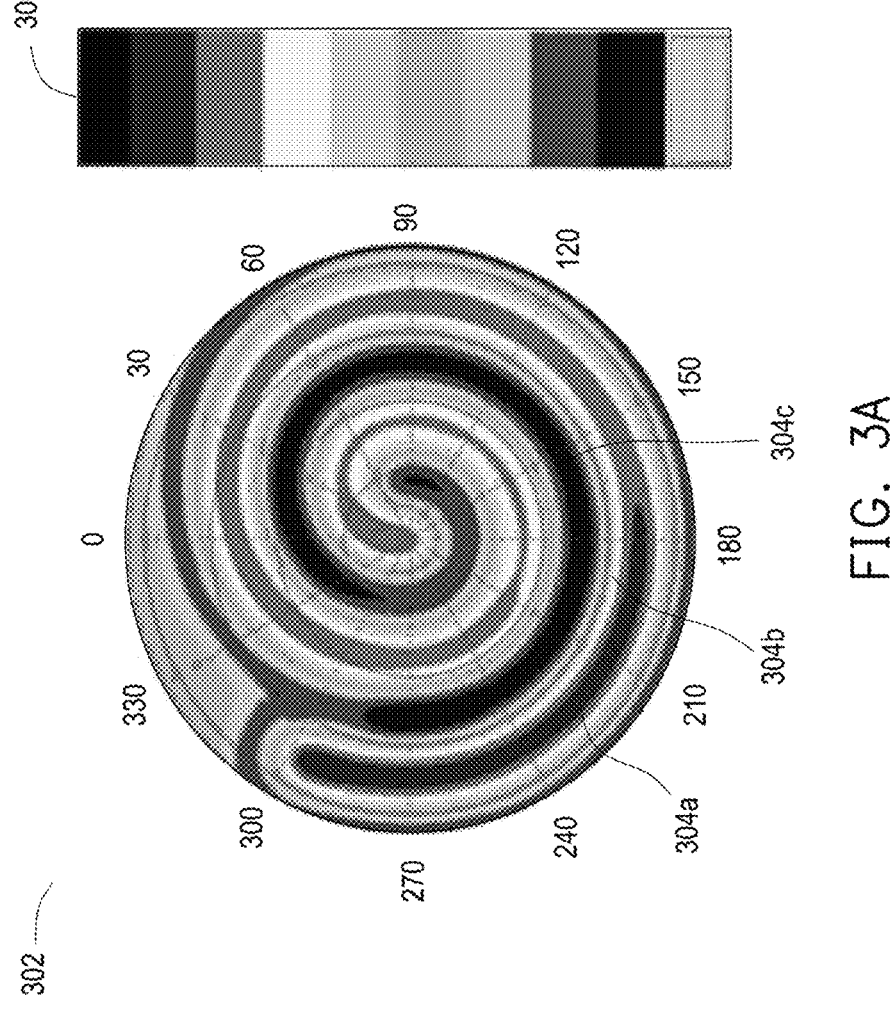
FIGS. 3A, 3B, 4A-4C, 5A, and 5B are diagrams of example implementations described herein.
Figure 3B:
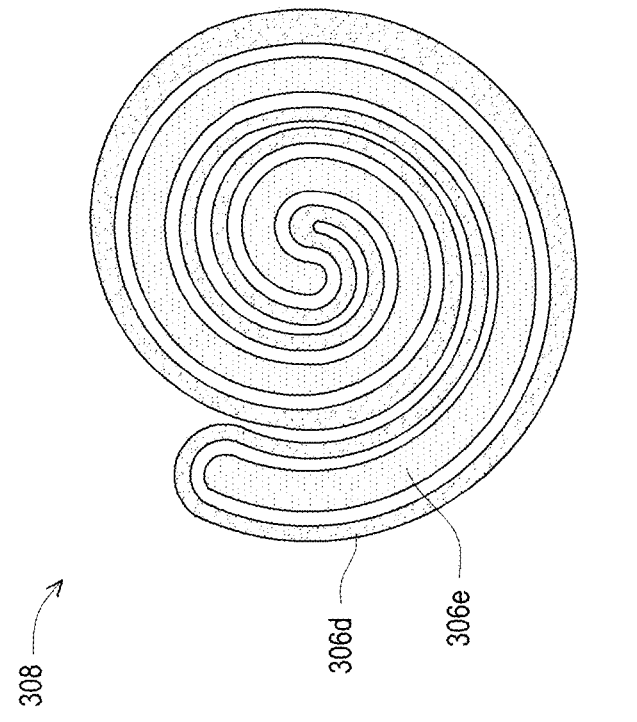

FIGS. 3A and 3B are diagrams of an example implementation 300 of the magnet component 228 described herein. FIG. 3A illustrates a top view of an electromagnetic field 302. emanating from the magnet component 228. In some implementations, the direct current power circuit 232 connected to the pedestal component 204 of FIG. 2A modulates the electromagnetic field 302.

As shown in FIG. 3A, the electromagnetic field 302 includes one or more spiral-shaped bands (e.g., the spiral-shaped band 304a, the spiral-shaped band 304b, and/or the spiral shaped band 304c, among other examples). Each spiral-shaped band 304a-304c may include a range of a magnetic strength 306 (e.g., a magnetic strength in oersteds (Oe) or amperes per meter (A/m), among other examples). In some implementations, each spiral-shaped band 304a-304c may include a different, respective range of the magnetic strength 306. In some implementations, each spiral-shaped band 304a-304c may include a different, respective distribution of the magnetic strength 306. In some implementations, each spiral-shaped band 304a-304c may include a different, respective mean or median magnitude of the magnetic strength 306.

The spiral-shaped bands 304a-304c, as modulated by the direct current power circuit 232, may promote or facilitate a uniform flow of particles of the inert metal material that are dislodged from the target structure 210 across the semiconductor substrate 206 during a deposition operation (e.g., during a sputtering operation). The uniform flow of particles may cause grain sizes of the layer of inert metal material that is deposited being greater relative to grain sizes of a layer of the inert metal material deposited without using the electromagnetic field 302 as modulated by the direct current power circuit 232. Additionally, or alternatively, the greater relative grain sizes may result in the layer of inert metal material having a resistivity that is lesser relative to a resistivity of a layer of the inert metal material deposited without using the electromagnetic field 302 as modulated by the direct current power circuit 232.

For example, depositing a layer of an inert metal material including ruthenium (Ru) using the electromagnetic field 302 that is modulated by the direct current power circuit 232 may produce a grain size that is included in a range of approximately 47.0 angstroms (Å) to approximately 47.6 Å. Additionally, or alternatively, a resistivity of the ruthenium (Ru) deposited using the electromagnetic field 302 that is modulated by the direct current power circuit 232 may be included in a range of approximately 31 micro ohms per centimeter ($\mu\Omega$/cm) to approximately 33 $\mu\Omega$/cm. However, other types of inert metal material, values and ranges of grain size, and/or values and ranges of resistivity are within the scope of the present disclosure.

The layer of the inert metal material deposited by the deposition tool 200 (e.g., using the electromagnetic field 302 as modulated by the direct current power circuit 232) may have one or more additional properties. For example, and for the layer of the inert metal material including ruthenium, an x-ray diffraction (XRD) orientation index <002>/<101> may be included in a range of approximately 1.65 to approximately 1.75. Additionally, or alternatively, a film density of the layer of the inert metal material including ruthenium may be greater than or equal to approximately 97%. However, other values and ranges for the x-ray diffraction orientation index and the film density are within the scope of the present disclosure.

As indicated above, the direct current power circuit 232 may modulate the electromagnetic field 302. By applying the direct current biasing power to the pedestal component 204, the direct current power circuit 232 may provide an electrical biasing voltage to the semiconductor substrate 206 that alters or changes a property of one or more of the spiral-shaped bands 306a-306c during a deposition operation within the processing chamber 202. As an example, a range of magnetic forces within one or more of the spiral-shaped bands 306a-306c may be reduced. Additionally, or alternatively, the range of magnetic forces within one of the spiral-shaped bands 306a-306c may be increased. Additionally, or alternatively, a distribution of magnetic forces within one or more of the spiral-shaped bands 306a-306c may be reduced. Additionally, or alternatively, a distribution of magnetic forces within one or more of the spiral-shaped bands 306a-306c may be reduced.

Modulating the electromagnetic field 302 may produce a grain size in the layer of inert metal material that is greater relative to a grain size of a layer of the inert metal deposited using a physical vapor deposition tool without the magnet component, the single cathode (e.g., a single instance of the target structure 210), and the power circuit. As a result, a resistivity characteristic of the layer of the inert metal material may be reduced to improve a yield and/or a performance of integrated circuit devices formed using the deposition operation.

FIG. 3B illustrates a top view of an electromagnetic field 308 emanating from the magnet component 228 of FIG. 2A. In some implementations, the direct current power circuit 232 connected to the pedestal component 204 of FIG. 2A modulates the electromagnetic field 308.

In FIG. 3B, the spiral shaped band 308d may correspond to a "northern" polarity. In FIG. 3B, the spiral shaped band 308e may correspond to a "southern" polarity. Additionally, or alternatively and using techniques similar to those described above, the polarities of the electromagnetic field 308 may be modulated by the direct current power circuit 232.

As indicated above, FIGS. 3A and 3B are provided as an examples. Other examples may differ from what is described with regard to FIGS. 3A and 3B. For example, another example may include additional spiral-shaped bands, fewer spiral-shaped bands, different shapes of bands, or differently arranged bands than those shown in FIGS. 3A and 3B.

Figure 4A:
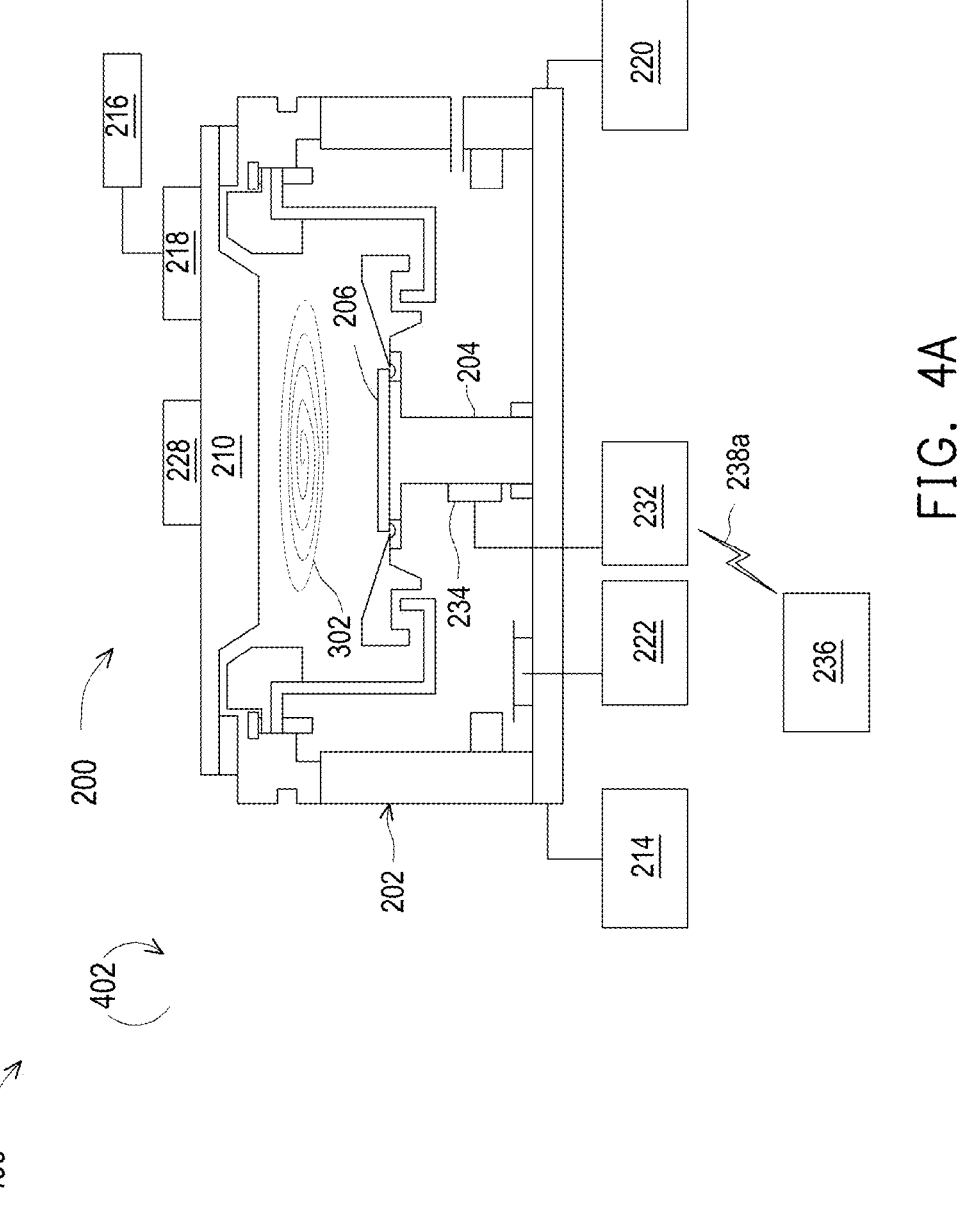
Figure 4B:
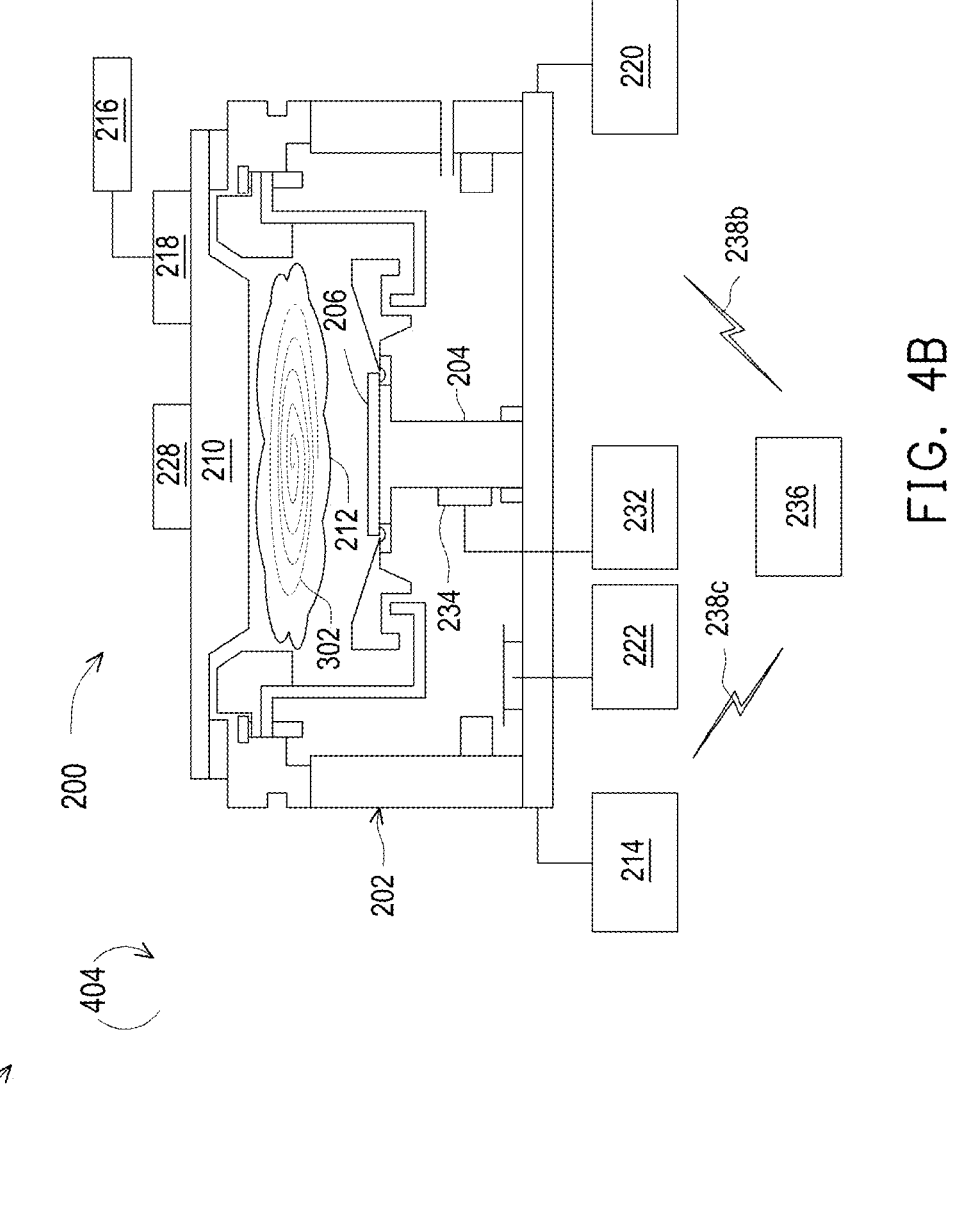
Figure 4C:
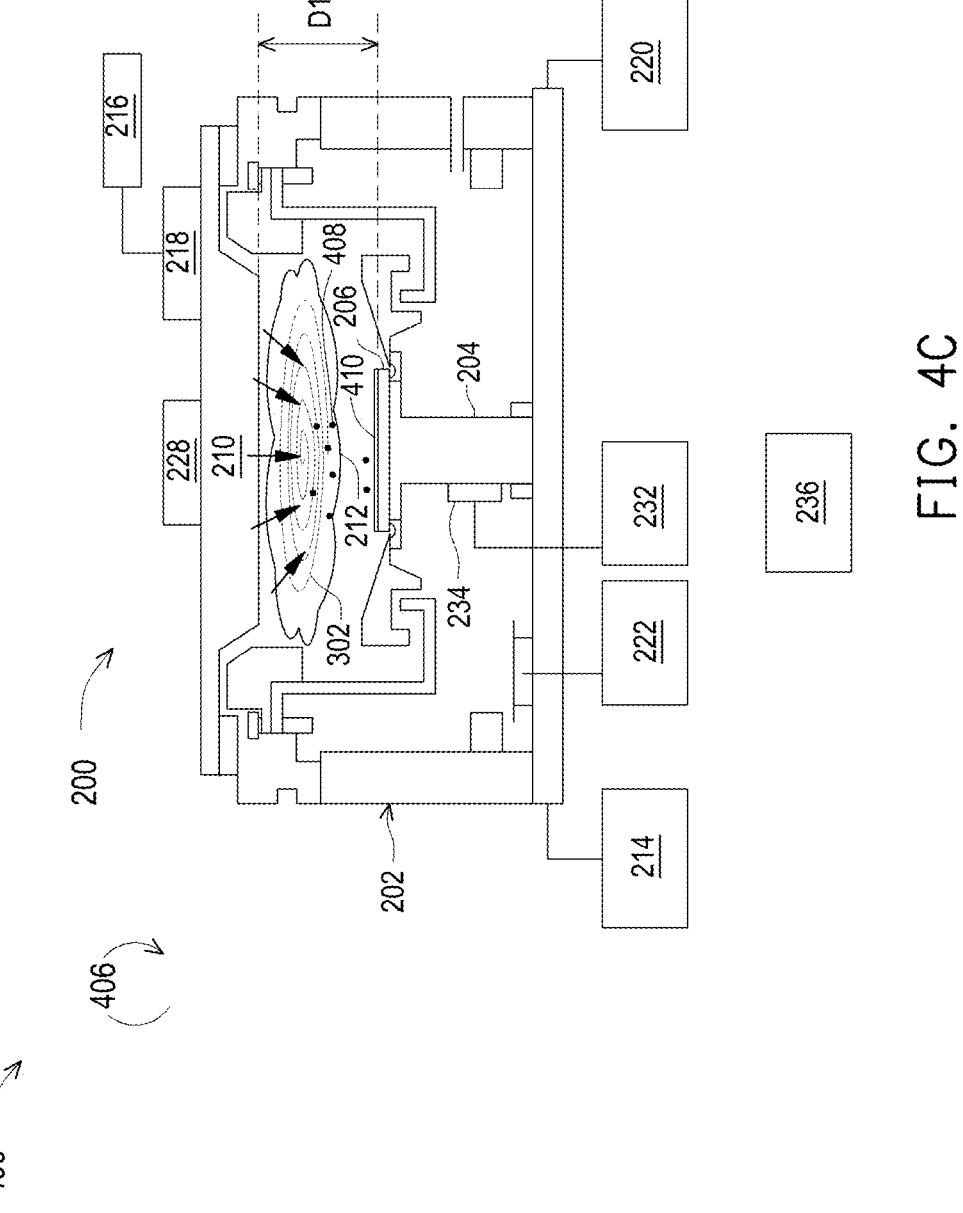

FIGS. 4A-4C are diagrams of an example implementation 400 described herein. In particular, the example implementation 400 includes an example process for performing a deposition operation using the deposition tool 200 described in connection with FIGS. 2 and 3. In some implementations, the deposition operation described in connection with FIGS. 4A-4C corresponds to a sputtering deposition operation.

As shown in FIG. 4A, an operation 402 includes the deposition tool 200 receiving the semiconductor substrate 206 onto the pedestal component 204. The semiconductor substrate 206 is received below the target structure 210 and below the electromagnetic field 302 emanating from the magnet component 228. In some implementations, the deposition tool 200 receives the semiconductor substrate 206 using the semiconductor substrate transfer system 126 as described in connection with FIG. 1.

Operation 402 further includes the controller 236 transmitting a signal using the communication link 238a to the direct current power circuit 232 to cause the direct current power circuit 232 to apply a direct current biasing power to the pedestal component 204. In some implementations, the direct current biasing power modulates the electromagnetic field 302 emanating from the magnet component 228. Modulating the electromagnetic field 302 may include, for example, modulating (e.g., "tuning") electromagnetic fields and/or waves within one or more spiral-shaped bands (e.g., one or more of the spiral-shaped bands 304a-304c, among other examples) to increase (or reduce) a range of magnetic forces within the one or more spiral-shaped bands. Additionally, alternatively, modulating the electromagnetic field 302 may include increasing (or decreasing) a mean or median magnitude of the magnetic forces within one or more of the spiral-shaped bands, among other examples. Additionally, alternatively, modulating the electromagnetic field 302 may include increasing (or decreasing) magnetic forces within one or more of the spiral-shaped bands, among other examples. As mentioned previously, the controller 236 may use a machine learning model to determine an amount of the direct current biasing power to be applied to the pedestal component 204 by the direct current power circuit 232.

As shown in FIG. 4B, an operation 404 includes the controller 236 transmitting a signal using the communication link 238b to the gas supply system 220 to initiate a flow of a gas (e.g., a krypton (Kr) gas, among other examples) into the processing chamber 202. The operation 404 further includes the controller 236 transmitting a signal using the communication link 238c to activate the radio frequency power circuit 214. Initiating the flow of the gas and activating the radio frequency power circuit 214 may generate the plasma 212 within the processing chamber 202.

As shown in FIG. 4C, and as part of an operation 406, a physical vapor deposition operation occurs within the processing chamber 202. Particulates 408 from the target structure 210 are dislodged and accelerated towards the semiconductor substrate 206 to form a layer of inert metal material 410 on a surface of the semiconductor substrate 206. In addition to using the plasma 212, the physical vapor deposition operation (e.g., a sputtering operation) includes modulation of an electromagnetic field (e.g., modulation of the electromagnetic field 302 as shown in FIG. 4C, and/or the electromagnetic field 308, through the direct current power circuit 232 providing a direct current biasing power to the pedestal component 204). Through modulation of the electromagnetic field 302 (and/or the electromagnetic field 308), one or more properties of the layer of inert metal material 410 may be controlled to satisfy a threshold. For example, a uniformity of the layer of inert metal material 410 may be controlled to satisfy a thickness threshold or a resistivity threshold, among other examples. Additionally, or alternatively, a grain size included in the layer of inert metal material 410 may be controlled to satisfy a threshold.

In some implementations, biasing of the electromagnetic field 302 (and/or the electromagnetic field 308) in combination with a type of gas (e.g., a Kr gas, among other examples) may increase grain sizes of the inert metal material 410 to reduce a resistivity of the inert metal material 410. Due to a size of atoms included in the gas (e.g., the Kr gas), energy levels may be increased to create a clustering that increases the grain size. Similarly, biasing of the electromagnetic field 302 may promote collimation of the atoms to enhance the clustering to increase the grain size.

In some implementations, the controller 236 monitors one or more parameters associated with the operation 406. For example, the controller 236 may monitor the direct current bias power provided by the direct current power circuit 232 to the pedestal component 204. Additionally, or alternatively, the controller 236 may adjust a setting of the direct current power circuit 232 based on the machine learning model described in connection with FIG. 2. Such a machine learning model may use inputs and/or outputs that include voltage parameters, deposition rates, and/or grain sizes, among other examples.

Within the deposition tool 200, a distance D1 between the semiconductor substrate 206 and the target structure 210 (e.g., and/or the magnet component 228) may be decreased relative to another deposition tool. For example, in some implementations, and during the deposition as part of operation 406, a bottom surface of the target structure 210 and a top surface of the pedestal component 204 are separated by a distance D1 that is included in a range of approximately 54 millimeters (mm) to approximately 66 mm (the distance in another deposition tool may be up to approximately 600 mm). If the distance D1 is less than approximately 54 mm, one or more properties of a thickness of the layer of inert metal material 410 (e.g., a target thickness or a variation in the thickness, among other examples) may not satisfy a threshold. If the distance D1 is greater than approximately 66 millimeters, an amount of foreign contaminants (e.g., particulates other than the particulates 408 dislodged from the target structure 210) in the processing chamber 202 during formation of the layer of the inert metal material 410 may increase to contaminate the layer of the inert metal material 410. Additionally, or alternatively, a distribution and/or magnitude of magnetic strengths associated with the electromagnetic field 302 (e.g., a distribution and/or magnitude of magnetic strengths associated with the spiral-shaped bands 304a-304b of FIG. 3, among other examples)

may be altered to decrease a rate and/or uniformity of the deposition associated with the operation 406. However, other values and ranges for the distance D1 are within the scope of the present disclosure.

As indicated above, FIGS. 4A-4C are provided as examples. Other examples may differ from what is described with regard to FIGS. 4A-4C. For example, another example may include additional operations, fewer operations, different operations, or differently arranged operations than those shown in FIGS. 4A-4C.

Figure 5A:
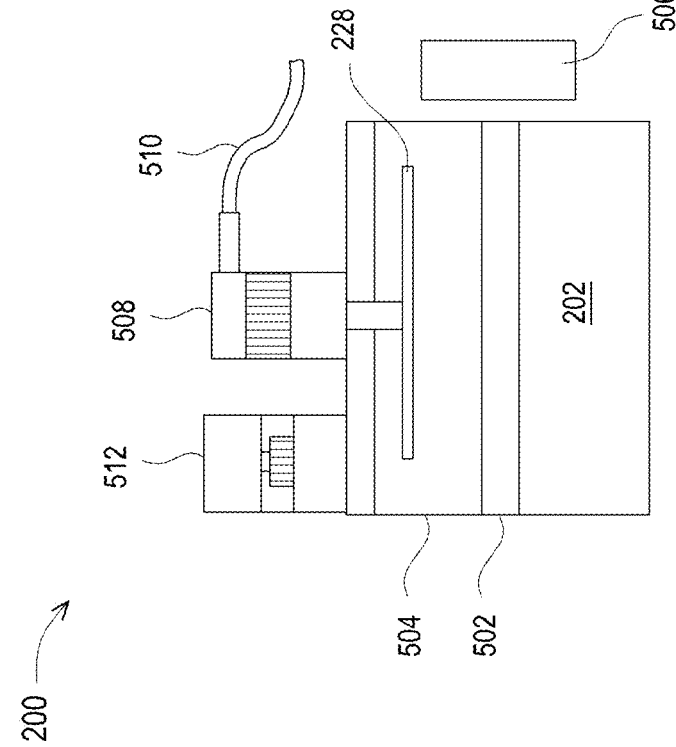
Figure 5B:
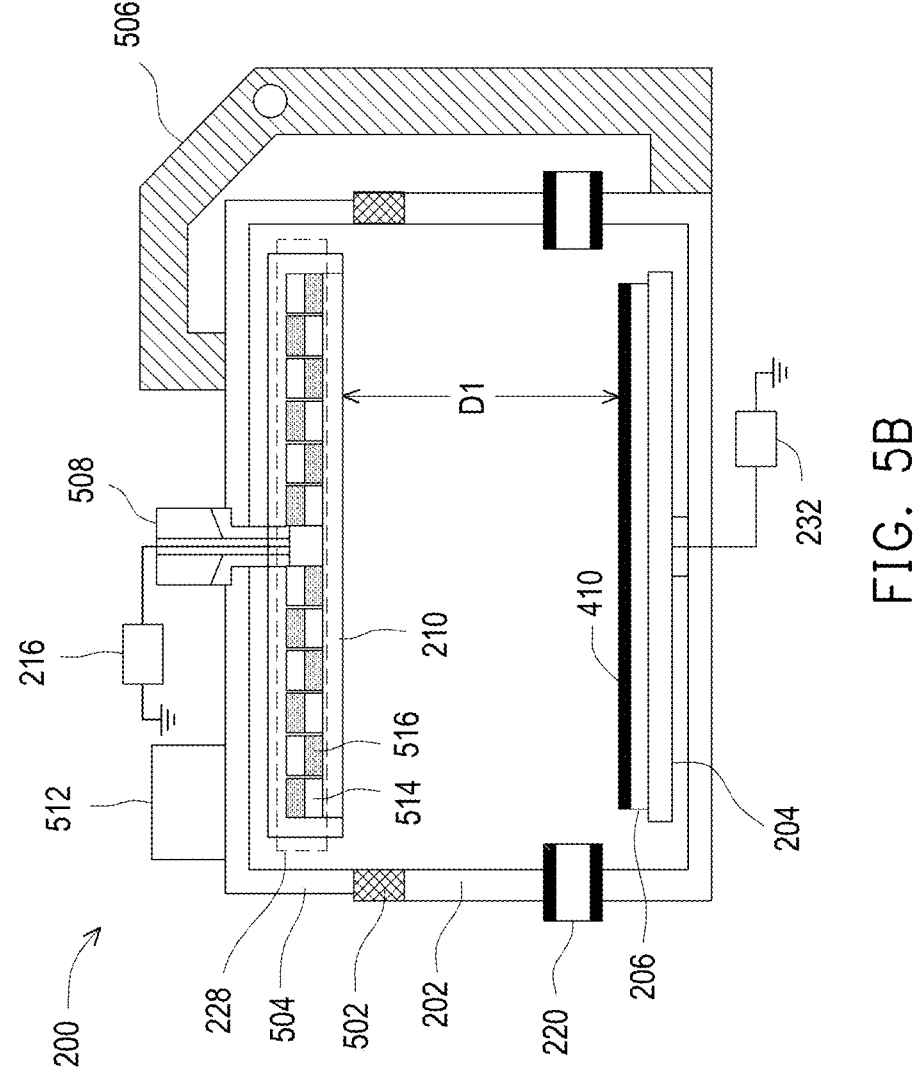

FIGS. 5A and 5B are diagrams of example an implementation 500 described herein. The implementation 500 may to a retrofit configuration of the deposition tool 200. Such a retrofit configuration may repurpose and/or recover one or more components from other tools as part of the deposition tool 200.

As shown in FIG. 5A, the deposition tool 200 includes the processing chamber 202. Although not shown, the processing chamber 202 (and/or the deposition tool 200 of FIG. 5A) may include one or more additional components as described in connection with FIGS. 2, 3A, 3B, and 4A-4C, including the pedestal component 204, the target structure 210, the vacuum pump 222, the gas supply system 220, and/or the direct current power circuit 232. In some implementations, the deposition tool 200 of FIG. 5A is configured to perform a deposition operation (e.g., a sputtering operation) at an ambient temperature.

The deposition tool 200 further includes an adapter component between a magnet chamber 504 and the processing chamber 202. The adapter component 502 may provide a mechanical interface (e.g., a coupling mechanism) between the magnet chamber 504 and the processing chamber 202. In some implementations, the adapter component 502 may include multiple subcomponents (e.g., an upper adapter component and a lower adapter component, among other examples) to improve a serviceability of the deposition tool 200.

In some implementations, the magnet chamber 504 is lined with a laminate material. In some implementations, the laminate material corresponds to a G-10 material. For example, the laminate material (e.g., the G-10 material) may correspond to a high-pressure fiberglass laminate material including layers of a glass cloth that have been soaked in an epoxy resin, compressed, and cured under a high-pressure/temperature condition. Such a laminate material may have a high strength, a high chemical resistance, and a low moisture absorption characteristic relative to another material.

The magnet component 228 is located within the magnet chamber 504. The deposition tool 200 of FIG. 5 further includes a mechanical arm structure 506 (e.g., a "pillow" mechanical arm structure), which may pivot and/or rotate the magnet chamber 504 into position above the adapter component 502 and the processing chamber 202.

In some implementations, and as shown in FIG. 5A, the deposition tool 200 includes a feed-through component 508. The feed-through component 508 may provide several mechanical functions. For example, in some implementations, the feed-through component 508 provides a mechanical interface for rotating or adjusting a position of the magnet component 228. Additionally, or alternatively and in some implementations, the feed-through component 508 is connected to a conduit 510 that provides a cooling fluid to the deposition tool 200. Additionally, or alternatively and in some implementations, a motor component 512 is coupled to the feed-through component 508 to actively rotate the magnet component 228 during a deposition process. In some implementations, the feed-through component 508 includes a magnet arm configured to move the magnet component 228 up and down (e.g., along a vertical axis) to control the distance between the target structure 210 and the pedestal component 204. Thus, the deposition rate of the sputtering process can be controlled by controlling the position of the magnet component 228 with the magnet arm. In some other implementations, the magnet arm has a fixed position and thus the magnet component 228 has a fixed position.

In implementation 500 of FIG. 5B, the retrofit configuration may include one or more components of the deposition tool 200 as described in connection with FIGS. 2, 3A, 3B, 4A-4C, 5A, and elsewhere herein. In some implementations, the deposition tool 200 of FIG. 5B is configured to perform a deposition operation (e.g., a sputtering operation) at an ambient temperature.

As shown in FIG. 5B, the deposition tool 200 includes the processing chamber 202, the pedestal component 204, and the semiconductor substrate 206 on the pedestal structure. The deposition tool further includes the target structure 210, the direct current power circuit 216, one or more components of the gas supply system 220 (e.g., valves, among other examples), and the magnet component 228. The magnet component 228 may include a combination of magnets with opposite polarizations (e.g., one or more of the northern polarity magnet 514 and one or more of the southern polarity magnet 516, among other examples). As described in connection with FIGS. 3A and 3B, the combination of magnets may generate an electromagnetic field (e.g., the electromagnetic field 302 and/or the electromagnetic field 308, among other examples) during a deposition operation that deposits the layer of inert metal material 410 on the semiconductor substrate 206. The deposition tool 200 further includes the direct current power circuit 232.

The deposition tool of FIG. 5B further includes the adapter component 502, the magnet chamber 504, the mechanical arm structure 506 (e.g., the pillow mechanical arm structure), the feed-through component 508, and the motor component 512. In the retrofit implementation of FIG. 5B, one or more dimensional properties of the mechanical arm structure 506 (e.g., a length, a height, or an angle, among other examples) may be modified such that the target structure 210 and the semiconductor substrate 206 (e.g., the layer of inert metal material 410) are separated by the distance D1 (e.g., in a range of approximately 54 millimeters to approximately 66 millimeters) as described in connection with FIG. 4C.

As indicated above, FIGS. 5A and 5B are provided as examples. Other examples may differ from what is described with regard to FIGS. 5A and 5B.

Figure 6:
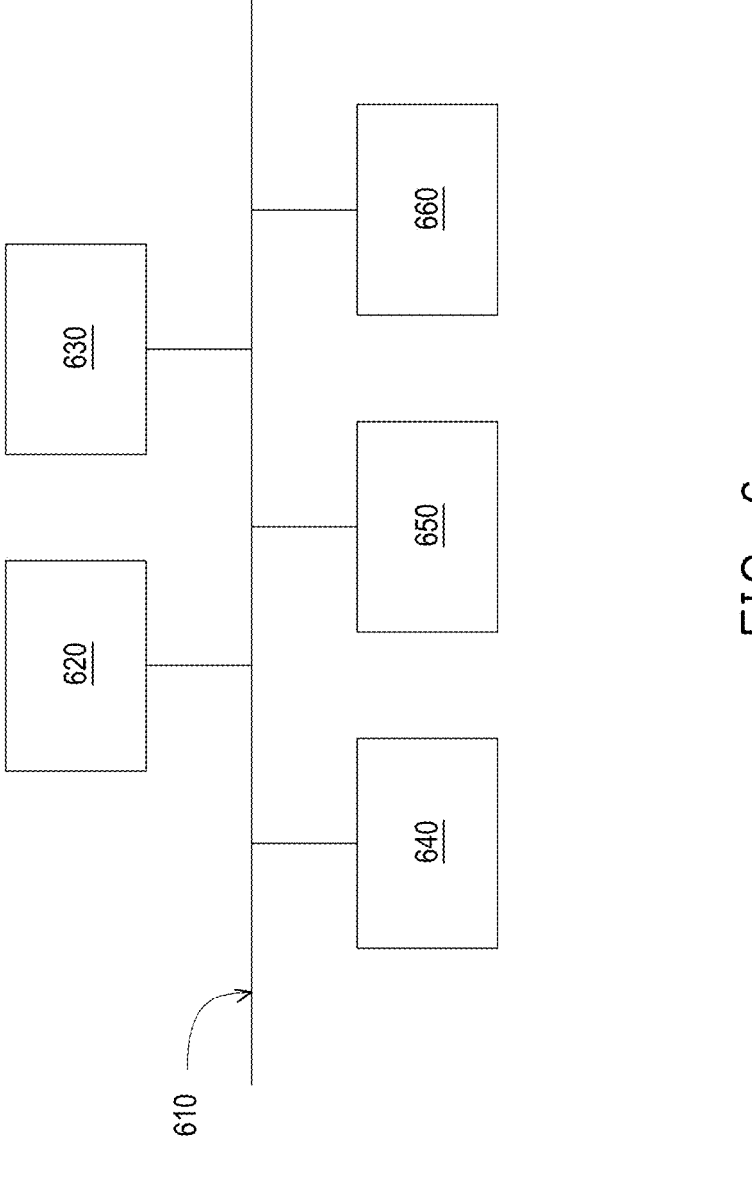
FIG. 6 is a diagram of example components of one or more devices of FIGS. 1, 2, and 5 described herein.

FIG. 6 is a diagram of example components of one or more devices of FIGS. 1, 2, and 5 described herein. In some implementations, the semiconductor processing system 100, the deposition tool 200, the gas supply system 220, the magnet component 228, the direct current power circuit 232, and/or the controller 236 include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a fieldprogrammable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 5 are provided as an example. Device 600 may include additional components, fewer components, different components, or differently arranged components than those shown in FIG. 5. Additionally, or alternatively, a set of components (e.g., one or more components) of device 600 may perform one or more functions described as being performed by another set of components of device 600.

FIG. 7 is a flowchart of an example process associated with performing a deposition operation using the deposition tool described herein. In some implementations, one or more process blocks of FIG. 7 are performed by a semiconductor processing tool (e.g., the semiconductor processing system 100). In some implementations, one or more process blocks of FIG. 7 are performed by another device or a group of devices separate from or including the semiconductor processing system 100, such as the deposition tool 200, the gas supply system 220, the magnet component 228, the direct current power circuit 232, and/or the controller 236. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include receiving a semiconductor substrate onto a pedestal component below a magnet component (block 710). For example, the deposition tool 200 may receive a semiconductor substrate 206 onto a pedestal component 204 below a magnet component 228, as described above.

As further shown in FIG. 7, process 700 may include applying a biasing power to the pedestal component to modulate an electromagnetic field emanating from the magnet component (block 720). For example, the deposition tool 200 (e.g., the direct current power circuit 232) may apply a biasing power to the pedestal component 204 to modulate an electromagnetic field 302 emanating from the magnet component 228, as described above. In some implementations, the electromagnetic field 302 includes spiral-shaped bands 306a-306c having different ranges of magnetic strength.

As further shown in FIG. 7, process 700 may include activating a deposition operation that uses the electromagnetic field including the spiral-shaped bands having different ranges of magnetic strength to form a layer of an inert metal material on the semiconductor substrate (block 730). For example, the deposition tool 200 may activate a deposition operation that uses the electromagnetic field 302 including the spiral-shaped bands 306a-306c having different ranges of magnetic strength to form a layer of an inert metal material 410 on the semiconductor substrate, as described above.

As further shown in FIG. 7, process 700 may include forming the layer of the inert metal material on the semiconductor substrate using the deposition operation (block 740). For example, the deposition tool 200 may form the layer of the inert metal material 410 on the semiconductor substrate 206 using the deposition operation, as described above.

Process 700 may include additional implementations, such as any single implementation or any combination of implementations described below and/or in connection with one or more other processes described elsewhere herein.

In a first implementation, applying the biasing power includes applying a direct current power from a direct current power circuit 216.

In a second implementation, alone or in combination with the first implementation, applying the biasing power includes monitoring the biasing power, and adjusting a setting of a power circuit providing the biasing power (e.g., the direct current power circuit 216) based on the biasing power not satisfying a threshold.

In a third implementation, alone or in combination with one or more of the first and second implementations, forming the layer of the inert metal material 410 on the semiconductor substrate 206 using the deposition operation includes forming a grain size that is greater relative to a grain size of another layer of the inert metal material formed using another deposition operation that excludes using the electromagnetic field 302 including the spiral-shaped bands having different ranges of magnetic strength.

In a fourth implementation, alone or in combination with one or more of the first through third implementations, forming the layer of the inert metal material 410 on the semiconductor substrate 206 using the deposition operation includes forming the layer of the inert metal material 410 to include a resistivity that is lesser relative to another resistivity of another layer of the inert metal material formed using another deposition operation that excludes using the electromagnetic field including the spiral-shaped bands having different ranges of magnetic strength.

In a fifth implementation, alone or in combination with one or more of the first through fourth implementations, forming the layer of the inert metal material 410 on the semiconductor substrate 206 using the deposition operation includes forming the layer of the inert metal material 410 on the semiconductor substrate 206 using a sputtering operation.

In a sixth implementation, alone or in combination with one or more of the first through fifth implementations, forming the layer of the inert metal material 410 on the semiconductor substrate 206 using the sputtering operation includes using a krypton gas and generating a plasma 212 between the semiconductor substrate 206 and a target structure 210 above the semiconductor substrate 206.

In a seventh implementation, alone or in combination with one or more of the first through sixth implementations, forming the layer of the inert metal material 410 on the semiconductor substrate 206 using the sputtering operation includes using a single cathode.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Some implementations described herein provide a physical vapor deposition tool. The physical vapor deposition tool includes a magnet component, a single cathode, and a power circuit for biasing a pedestal component that supports a semiconductor substrate. During a deposition operation that deposits an inert metal material and using the power circuit to bias the pedestal component, the physical vapor deposition tool may modulate an electromagnetic field emanating from the magnet component. The electromagnetic field includes spiral-shaped bands having different ranges of magnetic strengths. Within the physical vapor deposition tool, a spacing between the magnet component and pedestal component (e.g., a semiconductor substrate supported by the pedestal component) may be reduced (relative to another physical vapor deposition tool) such that one or more properties of the electromagnetic field (e.g., a strength or polarity) are redistributed to increase a deposition rate. As such, the physical vapor deposition tool may have an increased throughput relative to a physical vapor deposition tool without the magnet component, the single cathode, the power circuit, and/or the reduced spacing. Additionally, or alternatively, the layer of the inert metal may have a grain size that is greater relative to a grain size of a layer of the inert metal deposited using the physical vapor deposition tool without the magnet component, the single cathode, the power circuit, and/or the reduced spacing. With such a grain size, a resistivity of the inert metal layer may be reduced.

In this way, a number of resources (e.g., a number of physical vapor deposition tools and supporting infrastructure, such as computing or network resources) used to fabricate a quantity of integrated circuit devices are reduced. Additionally, or alternatively, a resistivity characteristic of the integrated circuit devices may be reduced to improve a yield and/or a performance of the integrated circuit devices.

As described in greater detail above, some implementations described herein provide a deposition tool. The deposition tool includes a magnet component. The deposition tool includes a processing chamber below the magnet component. The deposition tool includes a target structure including an inert metal material within processing chamber, where the target structure is configured to perform as a single cathode within the processing chamber during a sputtering operation within the processing chamber. The deposition tool includes a pedestal component below the target structure within the processing chamber, where the pedestal component is configured to support a semiconductor substrate during the sputtering operation within the processing chamber. The deposition tool includes a power circuit connected to the pedestal component. The deposition tool includes a controller configured to activate the power circuit to provide a biasing power to the pedestal component during the sputtering operation, where providing the biasing power to the pedestal component modulates an electromagnetic field including spiral-shaped bands generated by the magnet component, and where the pedestal component performs as an anode during the sputtering operation. The magnetic structure and the target layer perform as a cathode.

As described in greater detail above, some implementations described herein provide a device. The device includes a magnet component. The device includes a single cathode. The device includes a gas supply system. The device includes a power circuit. The device includes a controller configured to activate the power circuit to bias the semiconductor substrate and modulate an electromagnetic field emanating from the magnet component, where the electromagnetic field includes spiral-shaped bands having different ranges of magnetic strength. The controller is further configured to activate the gas supply system and the single cathode, where the gas supply system and the single cathode are used in connection with generating a plasma over the semiconductor substrate.

As described in greater detail above, some implementations described herein provide a method. The method includes receiving a semiconductor substrate onto a pedestal component below a magnet component. The method includes applying a biasing power to the pedestal component to modulate an electromagnetic field emanating from the magnet component, where the electromagnetic field includes spiral-shaped bands having different ranges of magnetic strength. The method includes activating a deposition operation that uses the electromagnetic field including the spiral-shaped bands having different ranges of magnetic strength to form a layer of an inert metal material on the semiconductor substrate. The method includes forming the layer of the inert metal material on the semiconductor substrate using the deposition operation.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

As used herein, the term "and/or," when used in connection with a plurality of items, is intended to cover each of the plurality of items alone and any and all combinations of the plurality of items. For example, "A and/or B" covers "A and B," "A and not B," and "B and not A."

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A deposition tool, comprising:
a target structure including inert metal material;
a pedestal component, supporting a substrate, below the target structure; and
a controller configured to generate an electromagnetic field between the substrate and the target structure to facilitate a flow of the inert metal material onto the substrate, wherein the electromagnetic field includes spiral-shaped bands having different ranges of magnetic strength, wherein at least one of the spiral-shaped bands is entirely within another one of the spiral-shaped bands.

2. The deposition tool of claim 1,
wherein the controller is further configured to modulate the electromagnetic field between the substrate and the target structure.

3. The deposition tool of claim 2, wherein, to modulate the electromagnetic field, the controller is configured to:
apply a first electrical bias to the target structure, or
apply a second electrical bias to the pedestal component.

4. The deposition tool of claim 3,
wherein the first electrical bias is applied to the target structure to cause ions in a plasma to accelerate toward the target structure.

5. The deposition tool of claim 3,
wherein the second electrical bias is applied to the pedestal component to generate the electromagnetic field between the target structure and the substrate.

6. The deposition tool of claim 3,
wherein the second electrical bias is applied to the pedestal component to cause a modulation of the electromagnetic field between the substrate and the target structure.

7. A device, comprising:
a processing chamber, including:
a target structure including inert metal material; and
a pedestal component, supporting a substrate, below the target structure; and
one or more power circuits, connected to the pedestal component,
wherein the one or more power circuits are configured to generate an electromagnetic field between the substrate and the target structure to facilitate a flow of the inert metal material during a deposition process,
wherein the electromagnetic field includes spiral-shaped bands having different ranges of magnetic strength.

8. The device of claim 7, further comprising:
a gas supply system configured to supply one or more gases to the processing chamber to form a plasma between the target structure and the substrate.

9. The device of claim 8,
wherein an electrical bias, formed from the one or more power circuits, causes ions in the plasma to accelerate toward the target structure to sputter etch the target structure.

10. The device of claim 8,
wherein one or more gases comprises krypton or argon.

11. The device of claim 7, further comprising:
a vacuum pump configured to create a vacuum state in the processing chamber during the deposition process.

12. The device of claim 7, further comprising:
a shutter disc configured to protect the pedestal component from particulates or contaminants during the deposition process.

13. The device of claim 12, further comprising:
a shield configured to shield the substrate and the shutter disc during the deposition process; and
a platen ring configured to assist in maintaining a position of the substrate and shutter disc during the deposition process.

14. A deposition tool, comprising:
a target structure configured to deposit an inert metal material; and
a direct current power circuit configured to modulate an electromagnetic field, between a semiconductor substrate and the target structure, comprising spiral-shaped bands having different ranges of magnetic strength that promote or facilitate a uniform flow of the inert metal material onto a substrate on a pedestal component, wherein at least one of the spiral-shaped bands is entirely within another one of the spiral-shaped bands.

15. The deposition tool of claim 14,
wherein each spiral-shaped band of the spiral-shaped bands includes at least one of:
a different distribution of a magnetic structure, or
a different mean or magnitude of the magnetic strength.

16. The deposition tool of claim 14, wherein, to modulate the electromagnetic field, the direct current power circuit is configured to:
change at least one of a range of magnetic forces, or a distribution of magnetic forces, within one or more spiral-shaped bands of the spiral-shaped bands.

17. The deposition tool of claim 14, wherein, to modulate the electromagnetic field, the direct current power circuit is configured to modulate one or more of an electromagnetic field or an electromagnetic wave within at least one spiral-shaped band of the spiral-shaped bands.

18. The deposition tool of claim 14, further comprising:
a gas supply system configured to initiate a flow of gas towards the electromagnetic field.

19. The deposition tool of claim 18,
wherein the gas comprises krypton.

20. The deposition tool of claim 14,
wherein the direct current power circuit is further configured to control, based on modulating the electromagnetic field, a uniformity of a layer of the inert metal material on the substrate to satisfy at least one of a thickness threshold, a resistivity threshold, or a grain size threshold.

* * * * *